United States Patent
Kim et al.

(10) Patent No.: US 7,462,544 B2
(45) Date of Patent: Dec. 9, 2008

(54) METHODS FOR FABRICATING TRANSISTORS HAVING TRENCH GATES

(75) Inventors: Ji-Young Kim, Yongin-si (KR); Chang-Sub Lee, Suwon-si (KR); Sang-Jun Park, Suwon-si (KR); Hyo-June Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 197 days.

(21) Appl. No.: 11/100,596

(22) Filed: Apr. 7, 2005

(65) Prior Publication Data

US 2006/0001107 A1 Jan. 5, 2006

(30) Foreign Application Priority Data

Jul. 5, 2004 (KR) .................... 10-2004-0052065

(51) Int. Cl.
*H01L 21/336* (2006.01)

(52) U.S. Cl. ............... 438/294; 257/E21.429; 257/E21.655; 438/734; 438/739; 438/743; 438/756

(58) Field of Classification Search ........... 438/294, 438/734, 739, 743, 756; 257/E21.429, E21.655
See application file for complete search history.

(56) References Cited

U.S. PATENT DOCUMENTS

| 5,858,866 | A | 1/1999 | Berry et al. |
| 6,277,707 | B1 | 8/2001 | Lee et al. |
| 6,627,950 | B1 | 9/2003 | Bulucea et al. |
| 2005/0042833 | A1* | 2/2005 | Park et al. ............ 438/282 |
| 2005/0136616 | A1* | 6/2005 | Cho et al. ............ 438/425 |

FOREIGN PATENT DOCUMENTS

| KR | 1020010046211 A | 6/2001 |
| KR | 2002-0037297 | 5/2002 |
| KR | 1020020055147 A | 7/2002 |

OTHER PUBLICATIONS

Korean Office Action dated Feb. 28, 2006.

* cited by examiner

*Primary Examiner*—Richard Elms
*Assistant Examiner*—Michael Lulis
(74) *Attorney, Agent, or Firm*—Harness, Dickey & Pierce, P.L.C.

(57) ABSTRACT

A transistor including an active region and methods thereof. The active region may include corners with at least one of a rectangular, curved or rounded shape. The methods may include isotropically etching at least a portion of the active region such that the portion includes a desired shape.

37 Claims, 11 Drawing Sheets

METHODS FOR FABRICATING TRANSISTORS HAVING TRENCH GATES

PRIORITY STATEMENT

This application claims the benefit of Korean Patent Application No. 2004-0052065, filed Jul. 5, 2004, the contents of which are hereby incorporated herein by reference in their entirety.

BACKGROUND OF THE INVENTION

1. Field of the Invention

The present invention relates generally to a transistor and methods for fabricating the same, and more particularly to a transistor including an active region and methods for fabricating the same.

2. Description of the Related Art

Semiconductor devices may include an integrated circuit. Integrated circuits may include discrete devices (e.g., transistors). Because semiconductor devices may require a higher level of integration, smaller transistor gate sizes may be required. The electrical characteristics of transistors with reduced gate sizes may degrade due to a short channel effect, which may result from the reduced size of the gate. Several conventional methods exist which may reduce the short channel effect. These methods include reducing a junction depth (e.g., of a source and a drain) and increasing an effective channel length. The two above-described methods may be implemented for a recessed channel metal oxide semiconductor (MOS) transistor at the same time.

FIG. 1 is a cross-sectional view illustrating a prior art method of fabricating a MOS transistor.

Referring to FIG. 1, a buffer layer pattern 110 and a mask pattern 115 may be formed in a region of a semiconductor substrate 100. The semiconductor substrate 100 may be etched using the mask pattern 115 as an etch mask to form a trench. After a liner 250 is formed on a sidewall of the trench, an insulating layer filling the trench and covering a surface of the semiconductor substrate 100 may be formed. The insulating layer may be patterned to form a gate opening. The active region exposed in the gate opening may be isotropically etched to form a gate trench. A deposition process, a planarization process, and an etchback process may then be used to form isolation layers 605 and 610, a gate insulating layer 450, and a gate electrode 615.

However, fences (e.g., Silicon (Si) fences) may remain on other sidewalls (not shown) of the gate trench when the gate trench is formed. Fences may reduce the effective channel length, which may increase the short channel effect.

FIG. 2A is a cross sectional view illustrating a conventional method of fabricating a MOS transistor.

FIG. 2B is a cross-sectional view taken along the line I-I' of FIG. 2A.

FIG. 2C is a cross-sectional view taken along the line II-II' of FIG. 2A.

Referring to FIGS. 2A, 2B, and 2C, an isolation layer 25 may be formed in a region of a semiconductor substrate 21 to define an active region 22. A buffer layer pattern 31 and a mask pattern 32 may be formed on the semiconductor substrate 21 including the isolation layer 25. The active region 22 may be etched using the mask pattern 32 as an etch mask to form a gate trench 33. Fences 34 and 35 may remain on sidewalls of the gate trench 33 adjacent to the isolation layers 25.

The electrical characteristics (e.g., current, voltage, etc.) of the recessed channel MOS transistor may be determined by characteristics (e.g., length, width, depth, etc.) of the gate trench 33. Increasing the depth of the gate trench 33 may reduce the short channel effect and gate trenches (e.g., gate trench 33) may be formed at higher depths.

Referring to FIGS. 2A and 2C, the fences 34 and 35 may be formed on sidewalls of the gate trench 33 in contact with the isolation layers 25. When the remaining fences 34 and 35 are present on the sidewalls of the gate trench 33, a channel may be formed in the Si fences 34 and 35. As shown in FIGS. 2A and 2C, the fences 34 and 35 may be at a lesser depth than the depth of the gate trench 33. Thus, because a channel is formed at a lesser depth than the depth of the gate trench 33, the effective channel length may be decreased.

FIG. 2D is a cross sectional view illustrating a later step in the conventional method of fabricating the MOS transistor of FIG. 2A.

Referring to FIG. 2D, the remaining fences 34 and 35 may be removed by isotropically etching the semiconductor substrate. An etching gas and/or etching solutions may be used for the isotropic etching. As a result, the exposed surfaces of the active region 22, including the remaining fences 34 and 35, may be etched. The etch rate at the center of the gate trench 33 may be different (e.g., slower) than the etching rate at the region A. The etch rate difference may cause the gate trench 33 to be deeper and/or wider (e.g., due to excessive etching) because the etching process may continue until the fences 34 and 35 may be removed (e.g., at the slower etching rate). This process may cause sharp silicon residues in the region A of the gate trench 33 as shown in FIG. 2D.

When the sharp silicon residues are present in the region A of the gate trench 33, a field enhancement effect may occur in the region A. The field enhancement effect may cause a gate induced drain leakage (GIDL) current. The data retention characteristics of a semiconductor device such as a Dynamic Random Access Memory (DRAM) may degrade in response to the GIDL current.

SUMMARY OF THE INVENTION

An example embodiment of the present invention is a method of fabricating a transistor including forming an isolation layer in a region of a semiconductor substrate to define an active region, etching a portion of the active region to form a gate trench crossing the active region, the gate trench being formed with first and second sidewalls facing each other and being adjacent to the isolation layer and with third and fourth sidewalls facing each other and adjacent to the active region, isotropically etching the isolation layer to form undercut regions where the first and second sidewalls are adjacent to the third and fourth sidewalls and removing fences from the first and second sidewalls while forming the gate trench.

Another example embodiment of the present invention is a method of fabricating a transistor, including forming an isolation trench in a region of a semiconductor substrate to define an active region, forming a sidewall oxide layer and a liner, the sidewall oxide layer and the liner being stacked on sidewalls of the active region, forming an isolation layer filling the isolation trench, forming a hard mask layer on at least one surface of the semiconductor substrate, patterning the hard mask layer to form a mask pattern, the mask pattern including an opening which crosses over a portion of the active region, etching the portion of the active region using the mask pattern as an etch mask to form a gate trench crossing the active region, the gate trench including first and second sidewalls facing each other and adjacent to the sidewall oxide layer, and third and fourth sidewalls facing each other and adjacent to the active region, isotropically etching the sidewall oxide layer to form undercut regions where the first, second, third and fourth sidewalls are adjacent to each other and removing fences on the first and second sidewalls while forming the gate trench.

Another example embodiment of the present invention is a transistor, including an active region formed on a semiconductor substrate, at least one portion of the active region including a desired shape.

BRIEF DESCRIPTION OF THE DRAWINGS

The present invention will become more apparent by describing in detail example embodiments thereof with reference to the attached drawings in which.

DETAILED DESCRIPTION OF THE EXAMPLE EMBODIMENTS OF THE PRESENT INVENTION

Figure 1:
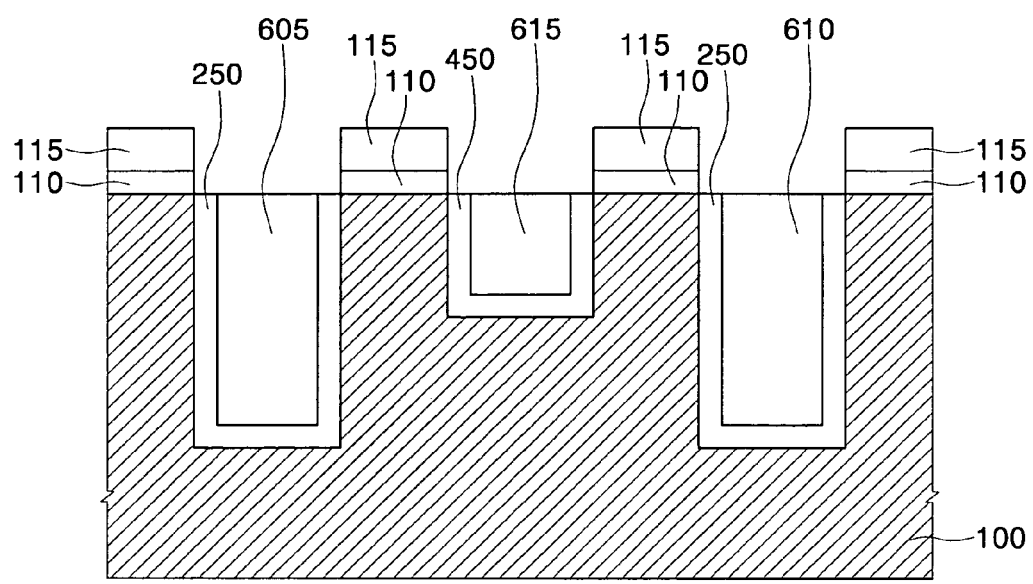
FIG. 1 is a cross-sectional view illustrating a prior art method of fabricating a MOS transistor.
Figure 2A:
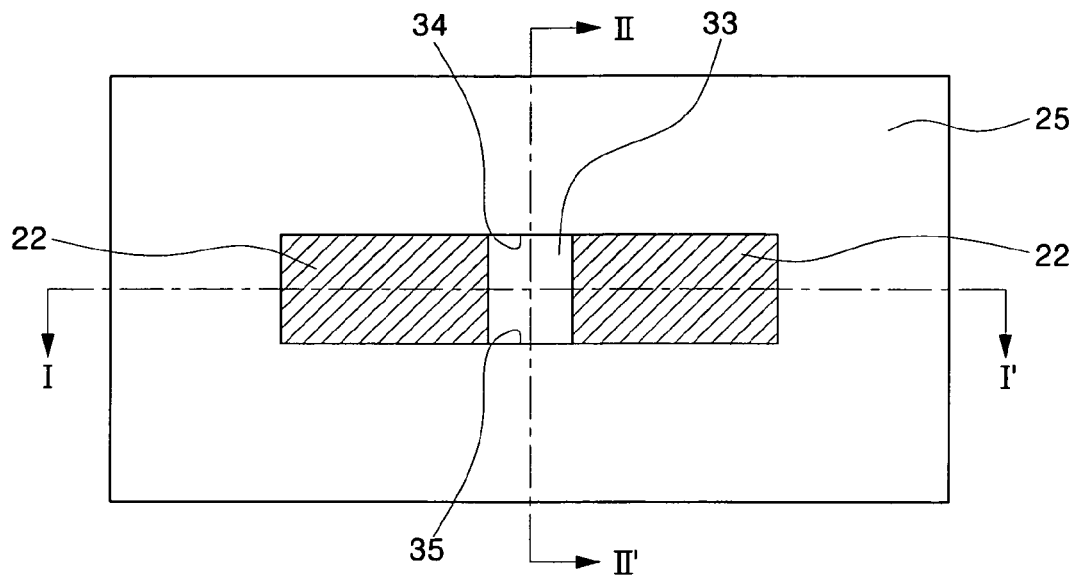
FIG. 2A is a cross sectional view illustrating a conventional method of fabricating a MOS transistor.
Figure 2B:
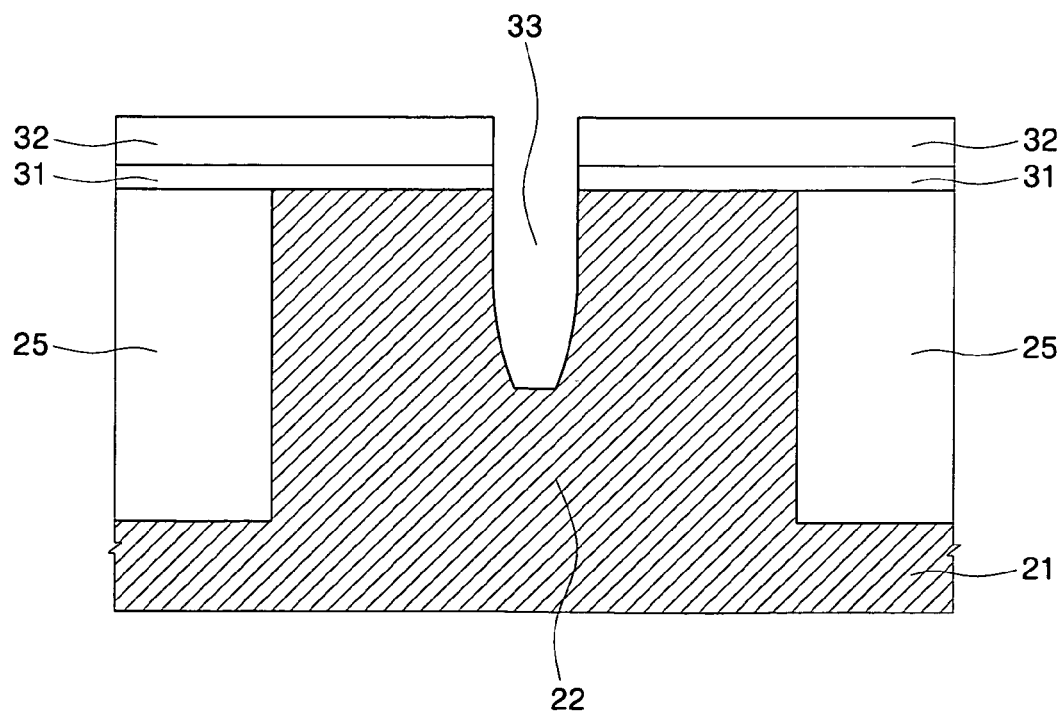
FIG. 2B is a cross-sectional view taken along the line I-I' of FIG. 2A.
Figure 2C:
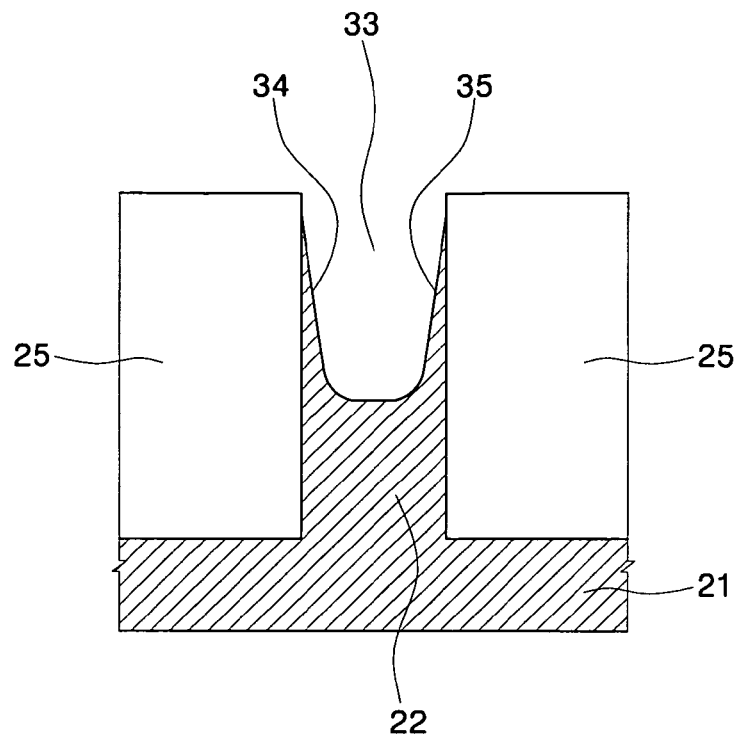
FIG. 2C is a cross-sectional view taken along the line II'-II' of FIG. 2A.
Figure 2D:
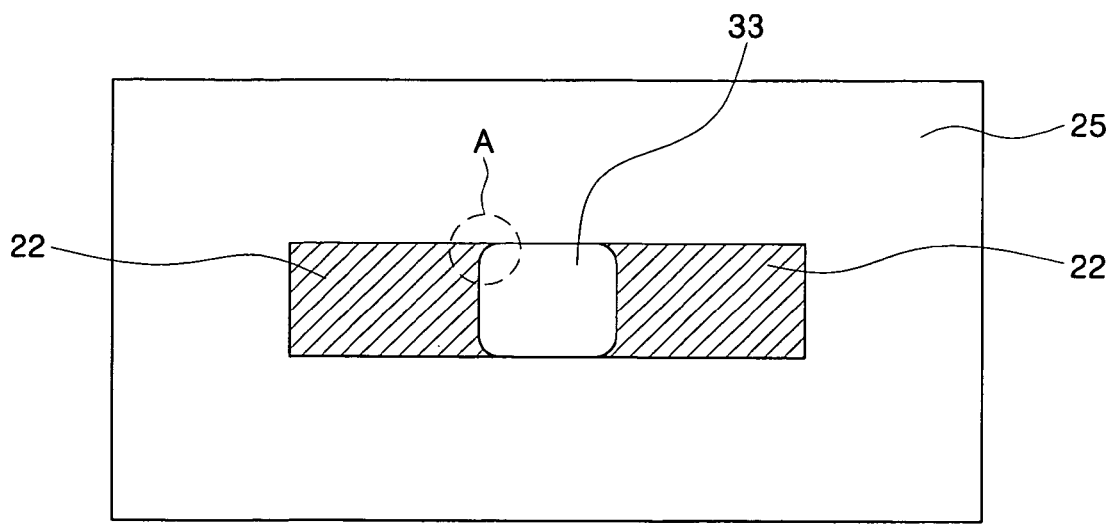
FIG. 2D is a cross sectional view illustrating a later step in the method of fabricating the conventional MOS transistor of FIG. 2A.

Hereinafter, example embodiments of the present invention will be described in detail with reference to the accompanying drawings. It is understood that characteristics (e.g., thicknesses of layers, regions, etc.) illustrated in the drawings are not drawn to scale.

In addition, when a layer is described to be formed on another layer and/or on a substrate, it is understood that this may indicate that the layer may be formed directly on the other layer or substrate, and/or any combination thereof indirectly (e.g., a third layer may be interposed between the layer and the other layer and/or the substrate), and/or any combination thereof.

In the Figures, the same reference numerals are used to denote the same elements throughout the drawings.

FIGS. 3A, 4A, 5A, and 6A are plan views illustrating methods of fabricating a recessed MOS transistor according to example embodiments of the present invention.

FIGS. 3B, 4B, 5B, and 6B are cross-sectional views taken along the line III-III' of FIGS. 3A, 4A, 5A, and 6A, respectively.

FIGS. 3C, 4C, 5C, and 6C are cross-sectional views taken along the line V-V' of FIGS. 3A, 4A, 5A, and 6A, respectively.

Figure 3A:
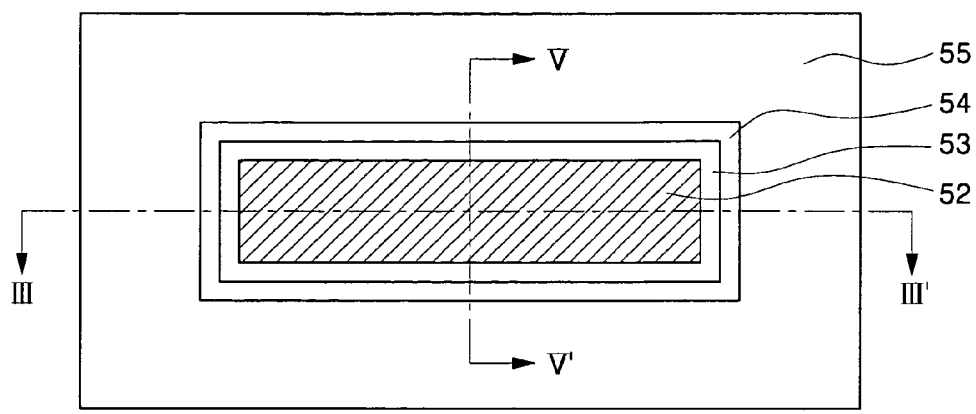
FIGS. 3A, 4A, 5A, and 6A are plan views illustrating methods of fabricating a recessed MOS transistor according to example embodiments of the present invention.
Figure 3B:
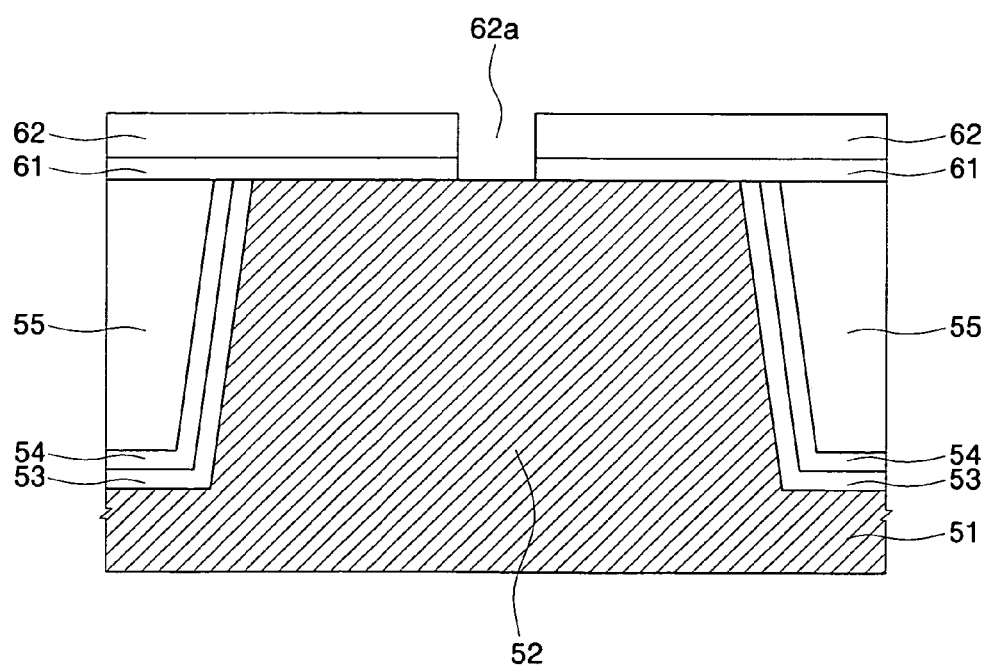
FIGS. 3B, 4B, 5B, and 6B are cross-sectional views taken along the line III-III' of FIGS. 3A, 4A, 5A, and 6A, respectively.
Figure 3C:
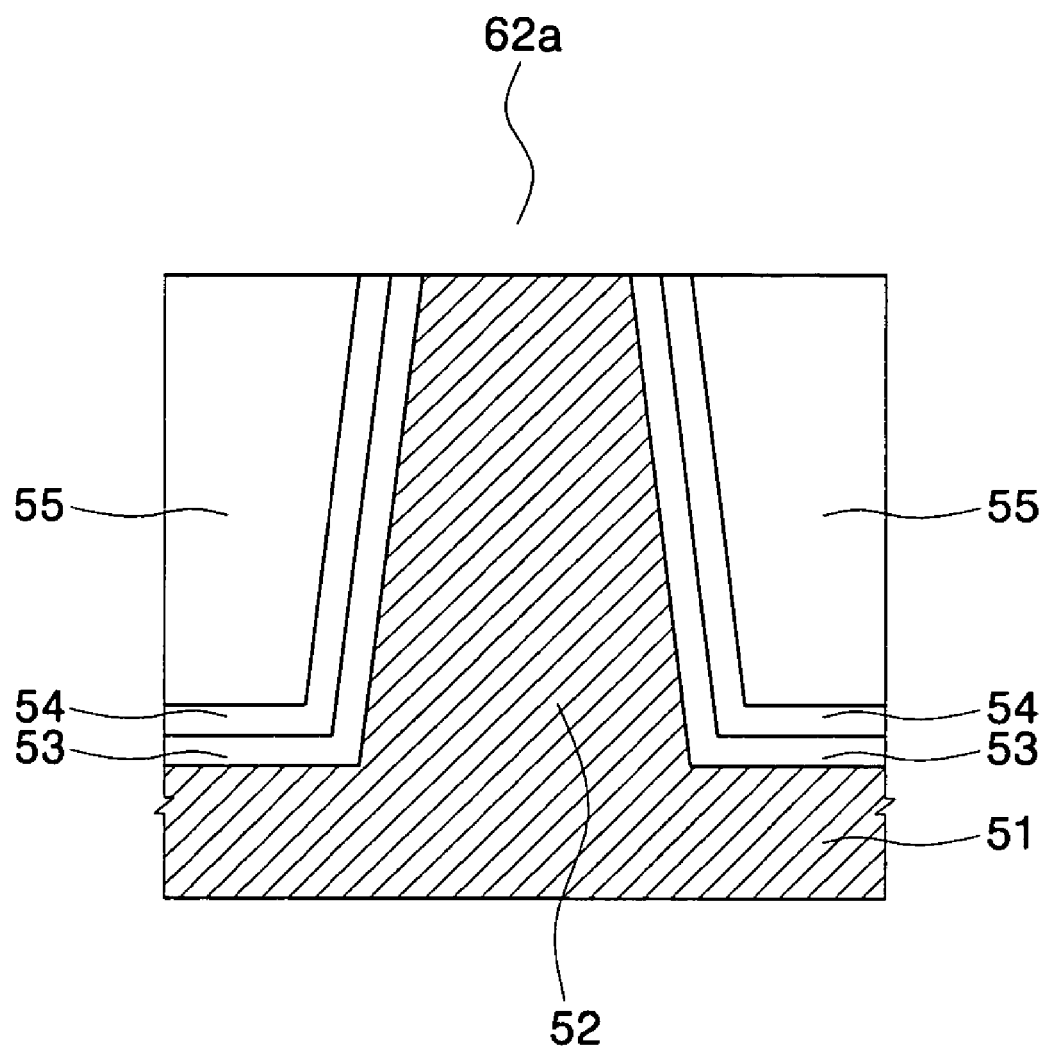
FIGS. 3C, 4C, 5C, and 6C are cross-sectional views taken along the line V-V' of FIGS. 3A, 4A, 5A, and 6A, respectively.

Referring to FIGS. 3A, 3B, and 3C, a trench mask pattern including a pad oxide layer and a pad nitride layer, which may be stacked, may be formed on a semiconductor substrate 51. A region of the semiconductor substrate 51 may be exposed.

In another example embodiment of the present invention, the pad oxide layer may relieve a physical stress (e.g., caused by a difference in a thermal expansion coefficient between the pad nitride layer and the semiconductor substrate 51), when the pad nitride layer is formed on the semiconductor substrate 51. The pad oxide layer may be formed by thermally oxidizing the semiconductor substrate 51. The pad nitride layer may include a material layer (e.g., a silicon nitride (SiN) layer) having etch selectivity to the semiconductor substrate 51.

In another example embodiment of the present invention, the semiconductor substrate 51 may be etched to form an isolation trench for defining an active region 52. The active region 52 may include various shapes (e.g., a positive sloped sidewall, a negative sloped sidewall, etc.) during formation. Hereinafter, for simplicity of explanation, the active region of the example embodiments of the present invention may be assumed to include a positive sloped sidewall. Thus, the width of the upper active region may be larger than the width of the lower active region in a plan view. However, it is understood that in other example embodiments, the active region 52 may include any shape (e.g., a negative sloped sidewall).

In another example embodiment of the present invention, a sidewall oxide layer 53 may be formed on an inner wall of the isolation trench. A liner 54 may be formed on the semiconductor substrate 51 (e.g., on the sidewall oxide layer 53). An insulating material layer may be formed on the semiconductor substrate 51 (e.g., on the liner 54), which may fill a space within the isolation trench and may cover a surface of the semiconductor substrate 51. The insulating material layer may be planarized to form an isolation layer 55.

In another example embodiment of the present invention, the planarization may be executed by a chemical mechanical polishing (CMP) process which may use the trench mask pattern as a stop layer.

In another example embodiment of the present invention, the sidewall oxide layer 53 may be a silicon oxide layer formed by thermal oxidation. The sidewall oxide layer may cover sidewalls of the active region 52. The sidewall oxide layer 53 may reduce damage in the semiconductor substrate 51 (e.g., damage created when the isolation trench is formed).

In another example embodiment of the present invention, the liner 54 may be formed of a material including oxidation resistant characteristics. For example, the liner 54 may be formed of a silicon nitride layer by a chemical vapor deposition (CVD) method.

In another example embodiment of the present invention, the isolation layer 55 may be formed of a material having etch selectivity to the semiconductor substrate 51. The isolation layer 55 may further include a material having gap filling characteristics and/or insulating characteristics. For example, the isolation layer 55 may include a silicon oxide layer (e.g., a high density plasma oxide layer) applied with a high density plasma chemical vapor deposition (HDPCVD) method. Oxide deposition and sputter etching may be applied repeatedly (e.g., alternating between oxide deposition and sputter etching) to form the high density plasma oxide layer, which may increase the filling characteristics of the layer. In addition, the high density plasma oxide layer may include a high etch selectivity to the semiconductor substrate 51. The trench mask pattern may be removed to expose the active region 52.

In another example embodiment of the present invention, the isolation layer 55 may be formed on the semiconductor substrate 51. The sidewall oxide layer 53 and the liner 54, which may be stacked, may be formed between the active region 52 and the isolation layer 55.

In another example embodiment of the present invention, a buffer layer and a hard mask layer may be formed on at least one surface of the semiconductor substrate 51 (e.g., on the isolation layer 55). The hard mask layer and the buffer layer may be patterned to form a mask pattern 62 and a buffer layer pattern 61. The mask pattern 62 and the buffer layer pattern 61 may include an opening 62a over the active region 52. The opening 62a may extend over the active region 52 and either or both of the isolation layers 55 adjacent to the active region 52 as shown in FIG. 3C. Portions of the active region 52 and/or the isolation layer 55 adjacent to the active region 52 may be exposed by the opening 62a.

In another example embodiment of the present invention, the buffer layer pattern 61 may include the same material layer as the above-described sidewall oxide layer. In this example embodiment, the buffer layer pattern 61 may be formed of a silicon oxide layer by thermally oxidizing the semiconductor substrate 51. The buffer layer pattern 61 may relieve a physical stress (e.g., due to a difference in a thermal expansion coefficient between the mask pattern 62 and the semiconductor substrate 51). The mask pattern 62 may be formed of a material having etch selectivity to the semiconductor substrate 51. For example, the mask pattern 62 may be formed of a silicon oxynitride (SiON) layer by a CVD method.

Figure 4A:
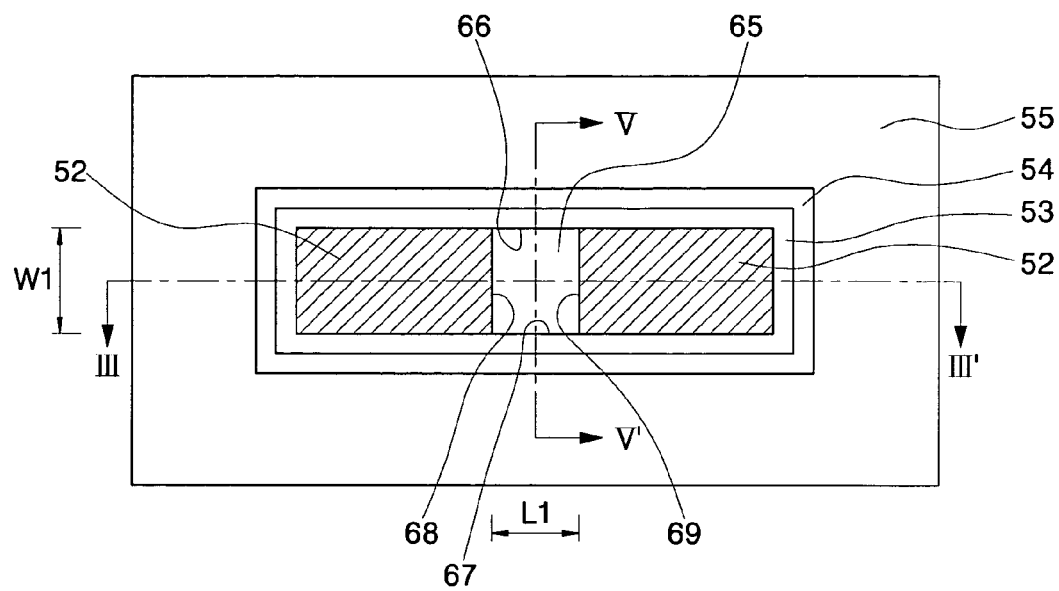
Figure 4B:
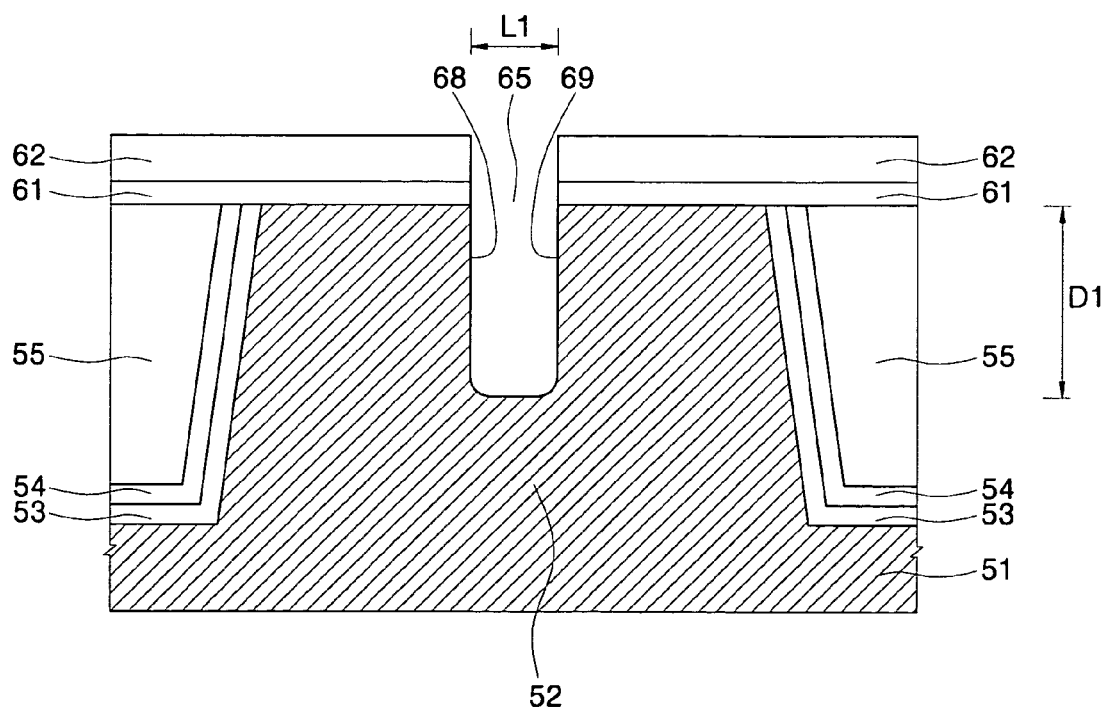
Figure 4C:
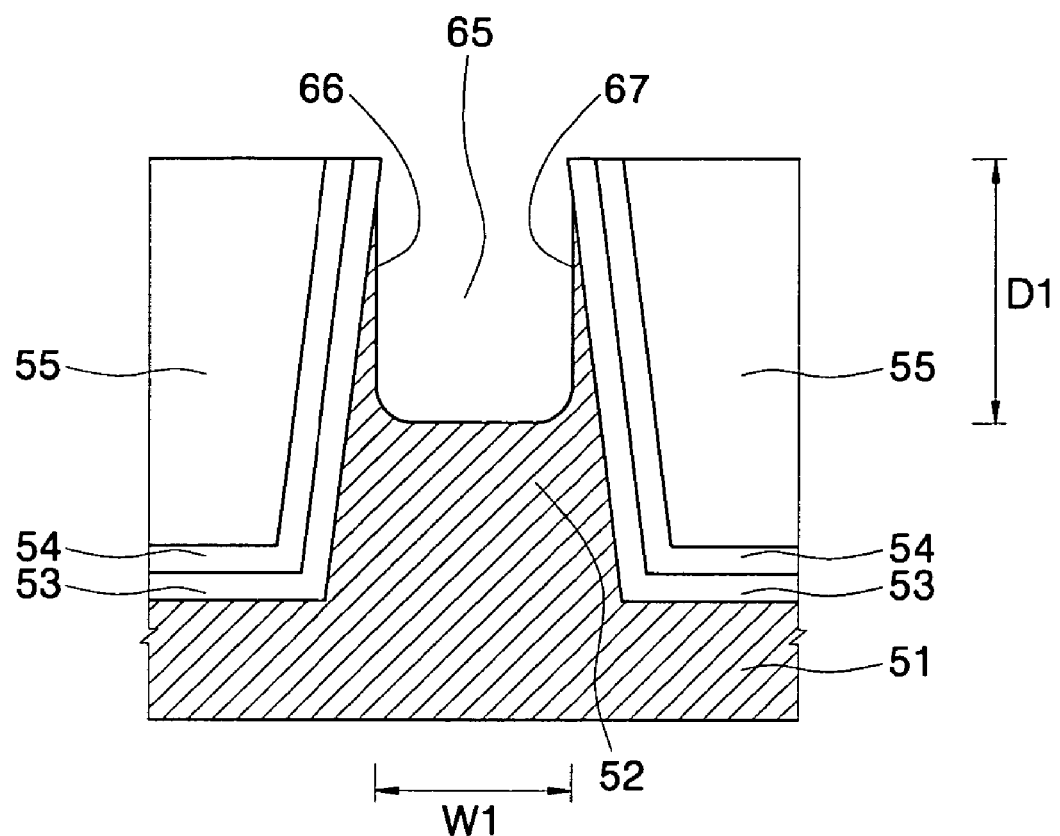

In another example embodiment of the present invention, referring to FIGS. 4A, 4B, and 4C, the active region 52 may be etched using the mask pattern 62 as an etch mask to form a gate trench 65. The gate trench 65 may include a first sidewall 66 and a second sidewall 67 which may face each other and may be adjacent to (e.g., in contact with) the isolation layer 55. The gate trench 65 may further include a third sidewall 68 and a fourth sidewall 69 which may face each other and may be adjacent to (e.g., in contact with) the active region 52.

In another example embodiment of the present invention, the etching may be applied when a high etch selectivity may be set between the active region 52, the silicon oxide layer, the silicon nitride layer and/or the silicon oxynitride (SiON) layer. Thus, the active region 52 may be recessed to form the gate trench 65. In this case, fences (e.g., semiconductor fences, Si fences, etc.) may remain on the first sidewall 66 and/or the second sidewall 67.

In another example embodiment of the present invention, the electrical characteristics (e.g., current, voltage, etc.) of the recessed channel MOS transistor may be determined by the length L1, the width W1, and/or the depth D1 of the gate trench 65. As the depth D1 of the gate trench 65 increases, the effective channel length may also increase. As previously discussed, a higher effective channel length may reduce the short channel effect.

In another example embodiment of the present invention, the fences may be formed along the sidewall oxide layer 53 in a longitudinal direction L1 with respect to the first and second sidewalls 66 and 67 of the gate trench 65 as shown in FIGS. 4A and 4B. When the formation of the sidewall oxide layer 53 and the liner 54 is not performed, the fences may be formed along the isolation layer 55. When the fences remain on the first and second sidewalls 66 and 67 of the gate trench 65, a channel may also be formed at the fences. When the channel is formed at the fences, the effective channel length may be decreased, which may increase the short channel effect.

Figure 5A:
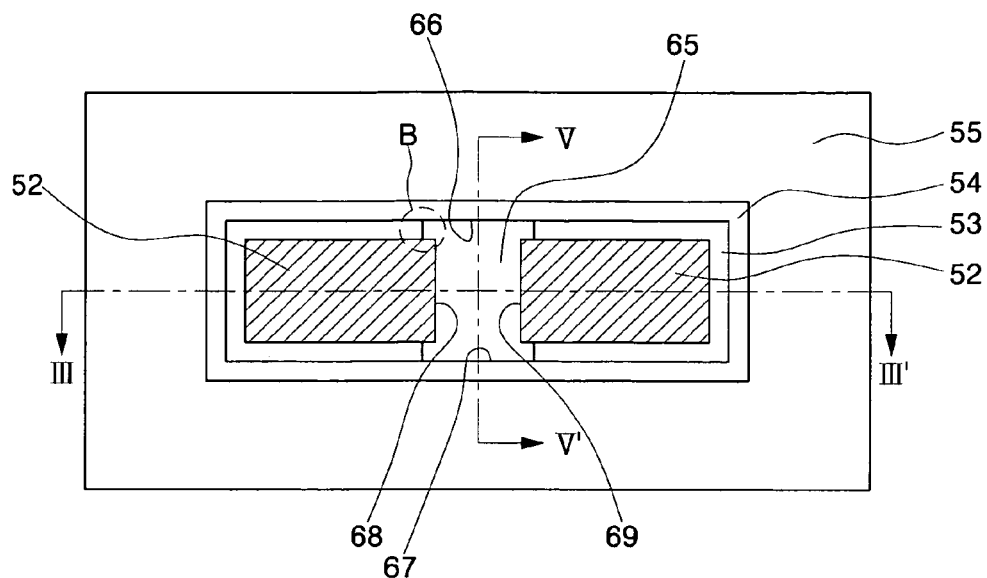
Figure 5B:
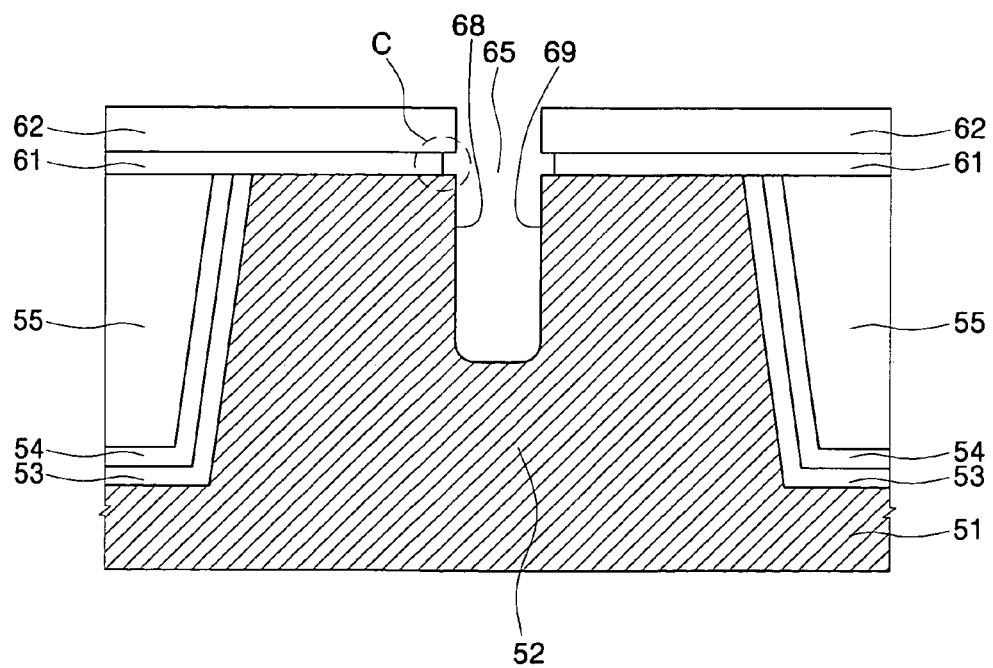
Figure 5C:
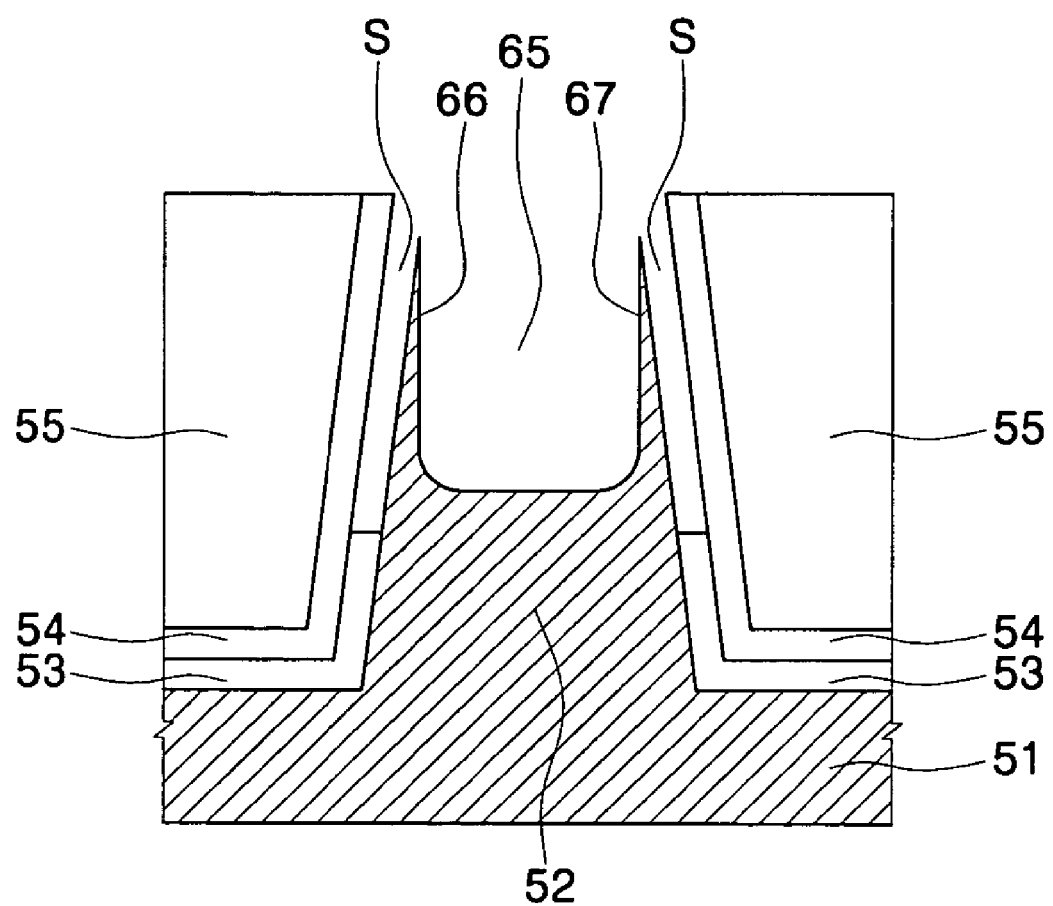

In another example embodiment of the present invention, referring to FIGS. 5A, 5B, and 5C, the isolation layer 55 may be isotropically etched to form undercut regions (e.g., in region B) where the first to fourth sidewalls 66, 67, 68, and 69 may be adjacent (e.g., in contact with) each other.

In another example embodiment of the present invention, the isotropic etching may be executed with a dry etching method or a wet etching method. The dry etching or wet etching may be carried out such that high etch selectivity may be set with respect to a silicon oxide layer. When the undercut regions are formed by the wet etching method, a wet cleaning solution including hydrofluoric acid (HF) may be used. The wet cleaning solution containing HF may have high etch selectivity with respect to the silicon oxide layer.

In another example embodiment of the present invention, while the isolation layer 55 is isotropically etched, the buffer layer pattern 61 may be formed including a silicon oxide layer and may be etched together to form undercut regions below the mask pattern 62.

The sidewall oxide layer 53 may be isotropically etched to form the undercut regions (e.g., in the regions B) where the first to fourth sidewalls 66, 67, 68, and 69 may be adjacent to (e.g., in contact with) each other when the sidewall oxide layer 53 and the liner 54 are formed. Etching may be performed on all exposed portions of the sidewall oxide layer 53 such that empty spaces S may be formed between the liner 54 and the fences. The empty spaces S may penetrate the regions (e.g., the regions B) where the first to fourth sidewalls 66, 67, 68, and 69 may be adjacent to (e.g., in contact with) each other to extend up to some regions of the sidewalls of the active region 52.

Figure 6A:
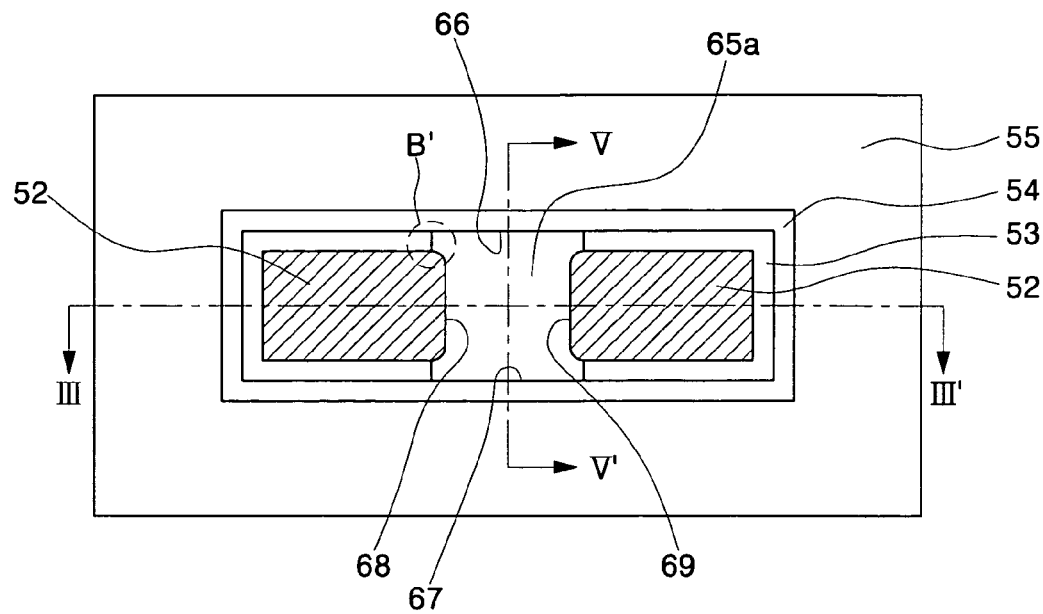
Figure 6B:
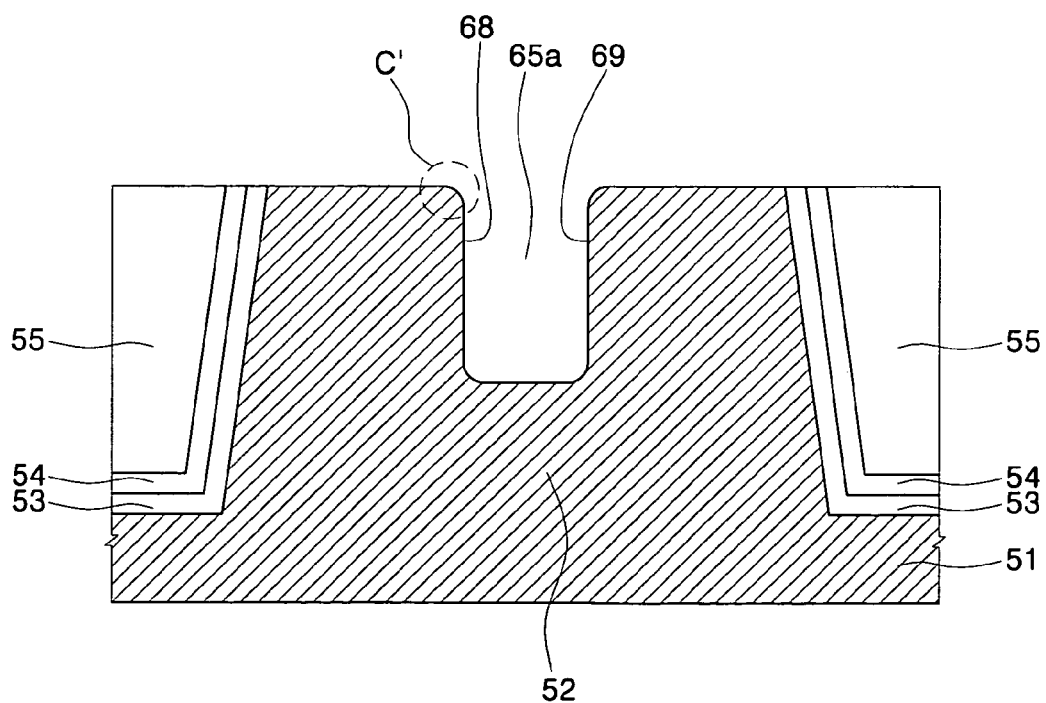
Figure 6C:
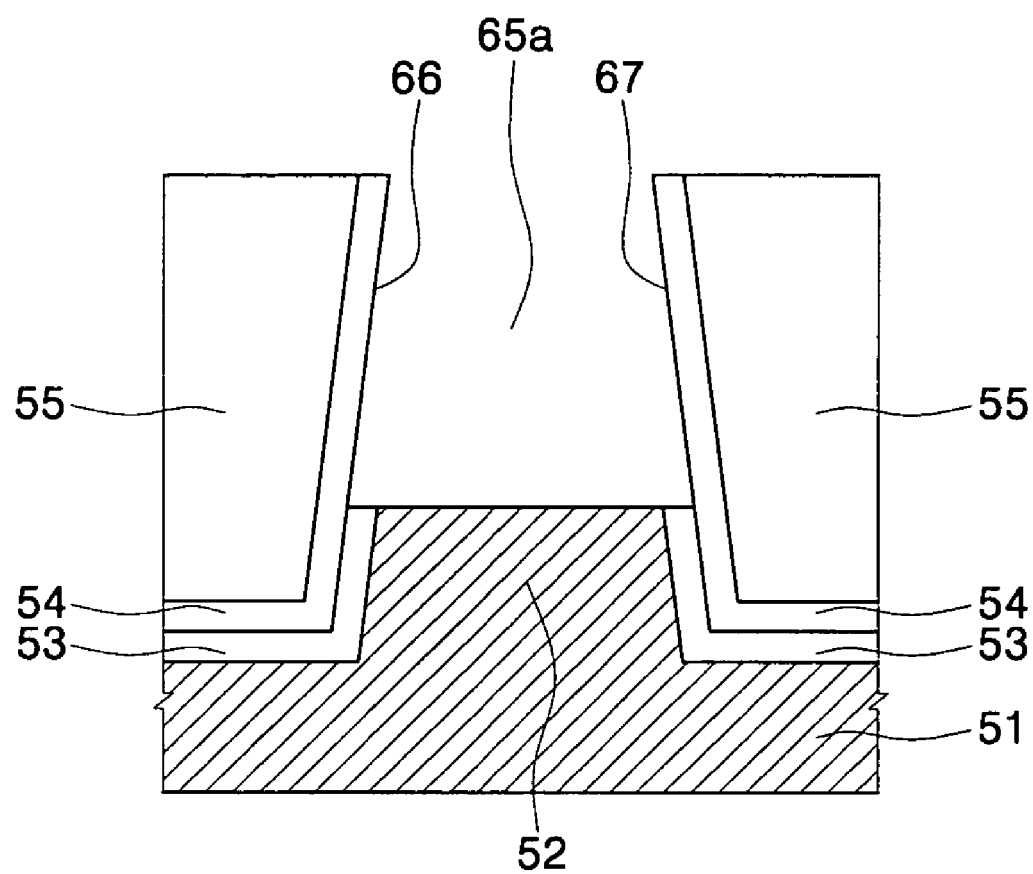

In another example embodiment of the present invention, referring to FIGS. 6A, 6B, and 6C, the semiconductor substrate may be isotropically etched to remove the fences. As a result, the fences on the active region 52 may be removed, and an extended gate trench 65a (e.g., with an increased effective channel length) may be formed.

In another example embodiment of the present invention, the isotropic etching may be executed by a dry etching method and/or a wet etching method. When the fences are removed by the wet etching method, a solution mixed with $NH_4OH$, $H_2O_2$, and $H_2O$ may be used. The mixed solution may have an oxidation reaction caused by $H_2O_2$ and/or an etching reaction by $NH_4OH$. The oxidation reaction and the etching reaction may occur at the same time. $NH_4OH$ may etch the silicon at a higher etching rate. A surface oxidation reaction by the $H_2O_2$ may reduce a roughness of the silicon surface.

In another example embodiment of the present invention, the undercut regions and the empty spaces S may provide a path through which the etching gas and/or etching solutions may flow, such that the fences may be removed as shown in FIG. 6C. The regions B where the first to fourth sidewalls 66, 67, 68, and 69 of the gate trench 65 may be adjacent to (e.g., in contact with) each other may include different etch rates. However, the regions where the first to fourth sidewalls 66, 67, 68, and 69 of the extended gate trench 65a may be adjacent to (e.g., in contact with) each other may include corners (e.g., corner B') of the active region 52 which may not include sharp silicon residues. Further, the corners (e.g., corner B') of the active region 52, which may be adjacent to the undercut regions, may be isotropically etched while the fences are removed, such that the corners (e.g., corner B') may be formed to have a curved shape (e.g., a rounded shape).

In another example embodiment of the present invention, when the depth and width of the undercut regions and the empty spaces S are varied, the corners (e.g., corner B') of the active region 52 may be formed at a desired shape. For example, the corner B' of the active region 52 may be formed to have curved shapes or rectangular shapes. Further, corners (e.g., corner C' as shown in FIG. 6B) where the upper surface of the active region 52 and the third sidewall 68 and the fourth sidewall 69 of the extended gate trench 65a may be adjacent to (e.g., in contact) with each other may also be formed to have a curved shape. The mask pattern 62 and the buffer layer pattern 61 may then be removed.

In another example embodiment of the present invention, channel ions may be implanted into the active region 52 within the extended gate trench 65*a*. An insulated gate electrode (not shown) may be formed to fill the extended gate trench 65*a*, and a source and a drain may be formed in a portion of the active region 52, such that the recessed channel MOS transistor including rounded (e.g., curved) active corners may be fabricated.

In another example embodiment of the present invention, undercut regions may be formed in regions where first to fourth sidewalls of a gate trench may be adjacent (e.g., in contact) to each other. The undercut regions may provide a path through which an etching gas and/or etching solutions may flow in an isotropic etching process, which may reduce or prevent sharp silicon residues from being left on corners of the active region. Further, corners of the active region may be formed to include a curved or rounded shape. Thus, the effective channel length may be increased by the extended gate trench. In one example, the recessed channel MOS transistor including rounded (e.g., curved) active corners may be suitable for a high integration semiconductor device The example embodiments of the present invention being thus described, it will be obvious that the same may be varied in many ways. For example, while corners of the above-described example embodiments formed to a given shape (e.g., curved, rounded, rectangular, etc.) it is understood that the corners may be formed to include any shape. Further, while each of the corners in the above-described example embodiments include the same shape (e.g., curved, rectangular, etc.), it is understood that corners do not require the same shape. Thus, in another example, one corner may have a rectangular shape and another corner may have a curved shape.

Such variations are not to be regarded as departure from the spirit and scope of the example embodiments of the present invention, and all such modifications as would be obvious to one skilled in the art are intended to be included within the scope of the following claims.

What is claimed is:

1. A method of fabricating a transistor, comprising:
    forming an isolation layer in a region of a semiconductor substrate to define an active region;
    etching a portion of the active region to form a gate trench crossing the active region, the gate trench being formed with first and second sidewalls facing each other and being adjacent to the isolation layer and with third and fourth sidewalls facing each other and adjacent to the active region;
    isotropically etching the isolation layer to form undercut regions where the first and second sidewalls are adjacent to the third and fourth sidewalls; and removing fences from the first and second sidewalls while forming the gate trench.

2. The method of claim 1, wherein the isotropic etching is applied while the fences are removed.

3. The method of claim 1, wherein the corners of the active region have a curved shape after the isotropic etching.

4. The method of claim 3, wherein the curved shape is a rounded shape.

5. The method of claim 1, further comprising:
    forming a sidewall oxide layer and a liner, the sidewall oxide layer and the liner being stacked between the active region and the isolation layer.

6. The method of claim 5, wherein the sidewall oxide layer includes a silicon oxide layer.

7. The method of claim 5, wherein the liner includes a silicon nitride layer.

8. The method of claim 1, wherein the isolation layer includes a high density plasma oxide layer.

9. The method of claim 1, wherein etching the portion of the active region to form the gate trench includes:
    forming a hard mask layer on at least one surface of the semiconductor substrate; and
    patterning the hard mask layer to form a mask pattern, the mask pattern including an opening which crosses over the portion of the active region.

10. The method of claim 9, wherein the at least one surface includes an entirety of an exposed surface of the semiconductor substrate.

11. The method of claim 9, further comprising:
    forming a buffer layer pattern between the mask pattern and the active region.

12. The method of claim 11, wherein the buffer layer pattern includes a silicon oxide layer.

13. The method of claim 11, further comprising:
    etching the buffer layer pattern while isotropically etching the isolation layer to form at least one undercut region below the mask pattern.

14. The method of claim 9, wherein the mask pattern includes a silicon oxynitride (SiON) layer.

15. The method of claim 1, wherein isotropically etching the isolation layer includes at least one of dry etching and wet etching.

16. The method of claim 15, wherein the wet etching includes applying a wet cleaning solution.

17. The method of claim 16, wherein the wet cleaning solution includes hydrofluoric acid (HF).

18. The method of claim 1, wherein removing the fences includes at least one of dry etching and wet etching.

19. The method of claim 1, wherein removing the fences includes applying a solution including at least one of NH4OH, H2O2, and H2O.

20. The method of claim 1, wherein the corners of the active region adjacent to the undercut regions are formed to have rectangular shapes.

21. A method of fabricating a transistor, comprising:
    forming an isolation trench in a region of a semiconductor substrate to define an active region;
    forming a sidewall oxide layer and a liner, the sidewall oxide layer and the liner being stacked on sidewalls of the active region;
    forming an isolation layer filling the isolation trench;
    forming a hard mask layer on at least one surface of the semiconductor substrate;
    patterning the hard mask layer to form a mask pattern, the mask pattern including an opening which crosses over a portion of the active region;
    etching the portion of the active region using the mask pattern as an etch mask to form a gate trench crossing the active region, the gate trench including first and second sidewalls facing each other and adjacent to the sidewall oxide layer, and third and fourth sidewalls facing each other and adjacent to the active region;
    isotropically etching the sidewall oxide layer to form undercut regions where the first, second, third and fourth sidewalls are adjacent to each other; and removing fences on the first and second sidewalls while forming the gate trench.

22. The method of claim 21, wherein the isotropic etching is applied while the fences are removed.

23. The method of claim 21, wherein the corners of the active region have a curved shape after the isotropic etching.

24. The method of claim 23, wherein the curved shape is a rounded shape.

25. The method of claim 21, wherein the sidewall oxide layer includes a silicon oxide layer.

26. The method of claim 21, wherein the liner includes a silicon nitride layer.

27. The method of claim 21, wherein the isolation layer includes a high density plasma oxide layer.

28. The method of claim 21, further comprising: forming a buffer layer pattern between the mask pattern and the active region.

29. The method of claim 28, wherein the buffer layer pattern includes a silicon oxide layer.

30. The method of claim 28, further comprising: etching the buffer layer pattern while isotropically etching the isolation layer to form an undercut region below the mask pattern.

31. The method of claim 21, wherein the mask pattern includes a silicon oxynitride (SiON) layer.

32. The method of claim 21, wherein isotropically etching the sidewall oxide layer includes at least one of dry etching and wet etching.

33. The method of claim 32, wherein the wet etching includes applying a wet cleaning solution.

34. The method of claim 33, wherein the cleaning solution includes hydrofluoric acid (HF).

35. The method of claim 21, wherein removing the fences includes at least one of dry etching and wet etching.

36. The method of claim 21, wherein removing the fences includes applying a solution including NH4OH, H2O2, and H2O.

37. The method of claim 21, wherein the corners of the active region adjacent to the undercut regions are formed to have rectangular shapes.

* * * * *